(12) United States Patent
Huang et al.

(10) Patent No.: US 7,936,032 B2
(45) Date of Patent: *May 3, 2011

(54) FILM TYPE PACKAGE FOR FINGERPRINT SENSOR

(75) Inventors: Ming-Liang Huang, Tainan (TW);
Yao-Jung Lee, Tainan (TW);
Ming-Hsun Li, Tainan (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 1075 days.

This patent is subject to a terminal disclaimer.

(21) Appl. No.: 11/727,200

(22) Filed: Mar. 23, 2007

(65) Prior Publication Data

US 2008/0085038 A1    Apr. 10, 2008

(30) Foreign Application Priority Data

Oct. 5, 2006 (TW) .............................. 95137189 A

(51) Int. Cl.
*H01L 31/107* (2006.01)
(52) U.S. Cl. .................. 257/433; 257/E21.499; 257/415
(58) Field of Classification Search .................. 257/99, 257/222, 433, E31.127, 432, E21.499, 415
See application file for complete search history.

(56) References Cited

U.S. PATENT DOCUMENTS

| | | | | |
|---|---|---|---|---|
| 6,740,950 B2* | 5/2004 | Paek | .............................. | 257/433 |
| 7,227,236 B1* | 6/2007 | Lee et al. | ....................... | 257/433 |
| 7,274,094 B2* | 9/2007 | Boon et al. | ..................... | 257/680 |
| 7,367,120 B2* | 5/2008 | Minamio et al. | ................ | 29/848 |
| 7,375,757 B1* | 5/2008 | Hoshino et al. | ............... | 348/340 |
| 7,582,944 B2* | 9/2009 | Fukuda et al. | ................ | 257/432 |
| 7,638,813 B2* | 12/2009 | Kinsman | ......................... | 257/99 |
| 2005/0236685 A1* | 10/2005 | Minamio | ....................... | 257/433 |
| 2006/0043513 A1* | 3/2006 | Kim | ................................. | 257/433 |
| 2006/0108656 A1* | 5/2006 | Minamio et al. | .............. | 257/433 |
| 2007/0069319 A1* | 3/2007 | Minamio et al. | .............. | 257/433 |
| 2007/0090478 A1* | 4/2007 | Chen et al. | ..................... | 257/433 |
| 2008/0187191 A1* | 8/2008 | Huang et al. | .................. | 382/124 |

FOREIGN PATENT DOCUMENTS

TW            1243437        11/2005

* cited by examiner

*Primary Examiner* — Nathan W Ha
(74) *Attorney, Agent, or Firm* — WPAT, P.C.; Anthony King

(57) ABSTRACT

A thin-film fingerprint sensor package primarily comprises a fingerprint sensor chip, a plurality of bumps, a wiring film with a plurality of leads and at least an encapsulant to encapsulate the bumps. A sensing area is formed on an active surface of the fingerprint sensor chip. The bumps are disposed on the active surface and located at two opposing sides of the sensing area. The wiring film has an opening to expose the sensing area. Each lead has an inner end and an outer end. The inner ends are located at two opposing sides of the opening and are bonded to the bumps. Preferably, the wiring film has a flexible extension and the outer ends of the leads are rerouted to the extension for external electrical connections.

16 Claims, 5 Drawing Sheets

FILM TYPE PACKAGE FOR FINGERPRINT SENSOR

FIELD OF THE INVENTION

The present invention relates to a fingerprint sensor package, especially, to a film-type fingerprint sensor package.

BACKGROUND OF THE INVENTION

There are many electronic devices to enhance our working efficiencies every day such as cellular phones, notebook computers, personal digital assistants (PDA), etc. Since the competitions among the same businesses are getting intense, trade secrets have drawn many attentions these days. Therefore, there are more and more electronic devices have included security screening devices such as fingerprint sensors to ensure the trade secrets will not be leaked out to the opponents, and only the owners of the electronic devices can initiate the electronic devices and access to the information inside the electronic devices through the scanning of their fingerprints. Moreover, with the fingerprint sensors added to these electronic devices, the market values of these electronic devices will be higher.

So far fingerprint sensors are fabricated by semiconductor processes and then assembled. The packages for fingerprint sensors are different from the conventional packages where the fingerprint sensor packages have exposed sensing areas for fingerprint recognition.

As shown in FIG. 1 and FIG. 2, a conventional fingerprint sensor package 100 is a BGA (Ball Grid Array) configuration and includes a substrate 110, a fingerprint sensor chip 120, a plurality of bonding wires 130 and an encapsulant 140. A sensing area 123 is formed on the active surface 121 of the fingerprint sensor chip 120. The back surface 122 of the fingerprint sensor chip 120 is attached to the top surface 111 of the substrate 110. The fingerprint sensor chip 120 is electrically connected to the substrate 110 by the plurality of bonding wires 130. The encapsulant 140 is formed on the top surface 111 of the substrate 110 by molding to encapsulate the bonding wires 130 and some portions of the fingerprint sensor chip 120 with the sensing area 123 exposed from the encapsulant 140. A plurality of external terminals 150 such as solder balls are disposed on the bottom surface 112 of the substrate 110 so that the fingerprint sensor package 100 can mechanically and electrically connect to an external printed circuit board by SMT, not shown in the figures, where all the mechanical and electrical connections are established at the bottom surface 112 of the substrate 110. Therefore, the overall thickness of the fingerprint sensor package 100 can not be reduced due to the heights of the external terminals 150 after SMT and the molding encapsulant 140. Moreover, during fingerprint recognition, the fingers will exert extra stresses on the fingerprint sensor chip 120 where the extra stresses will transmit to the bottom of the substrate 110 to break the external terminals 150 leading to electrically open.

In Taiwan R.O.C. Patent No. I243437, entitled "Sliding type thin fingerprint sensor package", a fingerprint sensor package is revealed. The back surface and sides of the fingerprint sensor chip is pre-molded by a molding protection layer, then a flexible printed circuit board is attached to the bonding pads disposed on one side of the fingerprint sensor chip, i.e., the encapsulation of the fingerprint sensor chip is done first then the attachment of the flexible printed circuit board is followed. However, there is a risk of contamination of the sensing area during encapsulation, moreover, the existing packaging processes and equipment can not be implemented.

SUMMARY OF THE INVENTION

The main purpose of the present invention is to provide a thin-film fingerprint sensor package where a fingerprint sensor chip is attached to a wiring film by rerouting the electrical connecting paths from the bumps on two opposing sides of the sensing area of the chip to a flexible extension of the wiring film to reduce the overall thickness of the fingerprint sensor package and to avoid electrical open due to the extra stresses exerted on the fingerprint sensor chip during fingerprint recognition to enhance the reliability of the packages. Moreover, the fingerprint sensor packages can be assembled by reel-to-reel packaging processes.

The second purpose of the present invention is to provide a thin-film fingerprint sensor package which can be assembled by conventional COF (Chip-On-Film) or TCP (Tape Carrier Package) packaging processes so that the encapsulant can be done by dispensing to avoid contamination of the sensing area of the chip without interfering the recognition of the fingerprints.

According to the present invention, a thin-film fingerprint sensor package primarily includes a fingerprint sensor chip, a plurality of first bumps, a plurality of second bumps, a wiring film and an encapsulant. A sensing area is formed on an active surface of the fingerprint sensor chip. The first bumps and the second bumps are disposed at two opposing sides of the sensing area. The wiring film has an opening to expose the sensing area. Furthermore, the wiring film includes a plurality of first leads and a plurality of second leads, where a plurality of inner ends of the first leads are bonded to the first bumps and a plurality of inner ends of the second leads to the second bumps. Preferably, a plurality of outer ends of the first leads and a plurality of outer ends of the second leads are rerouted to the same flexible extension of the wiring film. The first bumps and the second bumps are encapsulated.

DETAIL DESCRIPTION OF THE INVENTION

Please refer to the attached drawings, the present invention will be described by means of embodiment(s) below.

Figure 1:
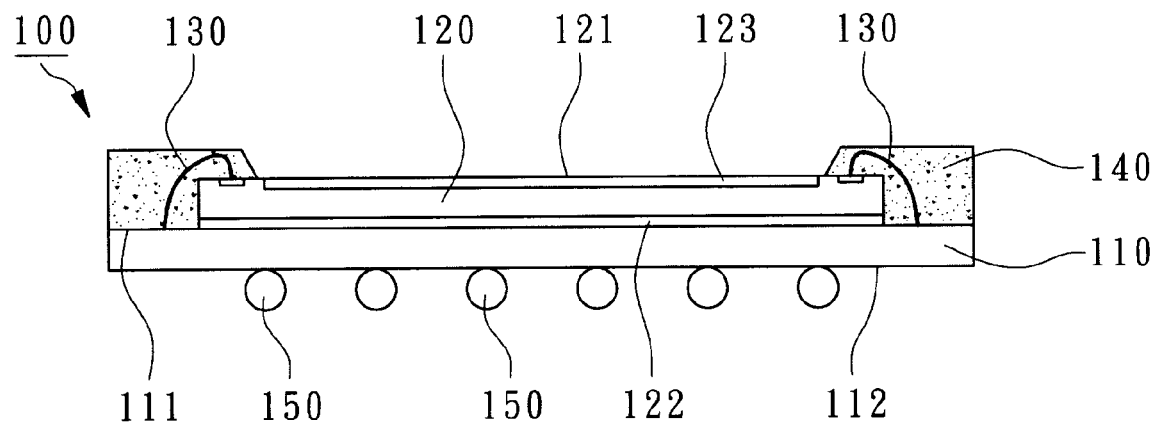
FIG. 1 shows a cross-sectional view of a conventional fingerprint sensor package.
Figure 2:
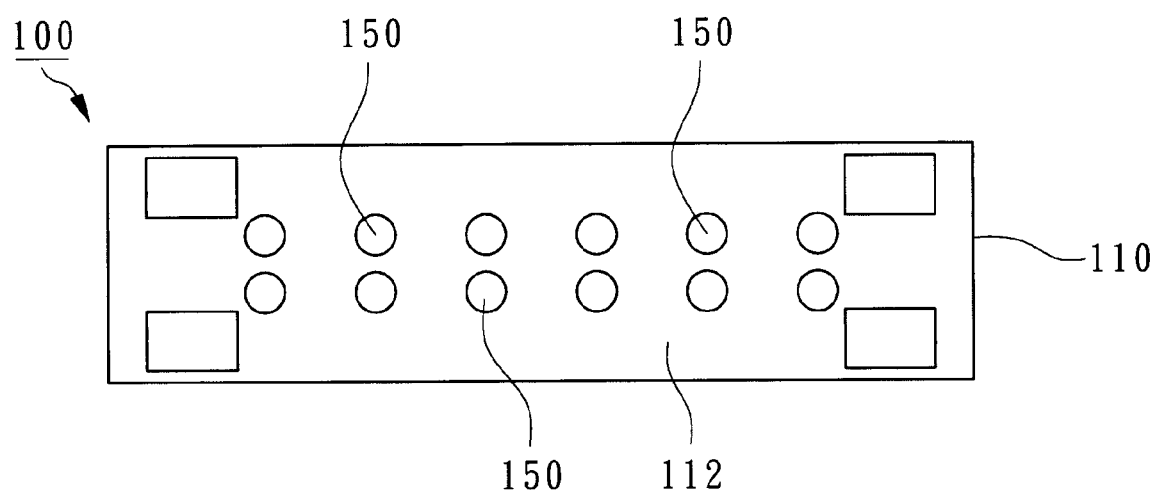
FIG. 2 shows a bottom view of the conventional fingerprint sensor package.
Figure 3:
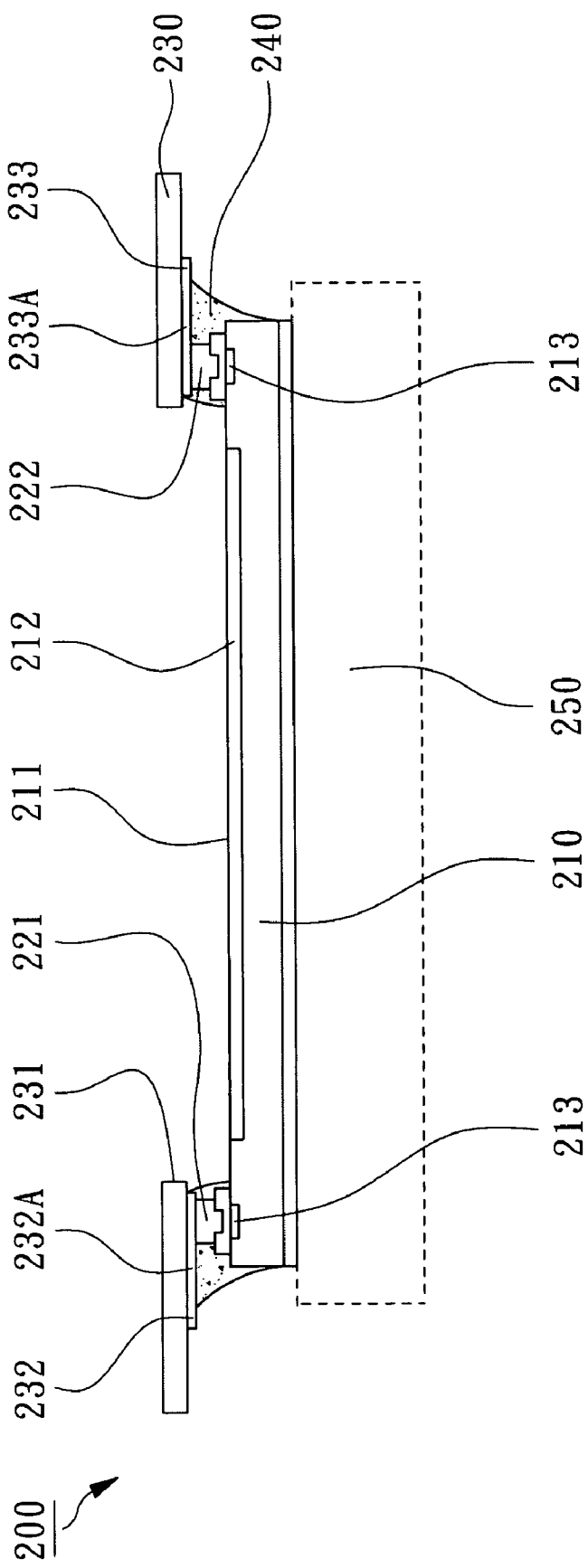
FIG. 3 shows a cross-sectional view of a thin-film fingerprint sensor package according to the first embodiment of the present invention.

According to the first embodiment of the present invention, as shown in FIG. 3, a thin-film fingerprint sensor package 200 primarily comprises a fingerprint sensor chip 210, a plurality of first bumps 221 a plurality of second bumps 222, a wiring film 230, and at least an encapsulant 240 where the wiring film 230 is the chip carrier for the fingerprint sensor chip 210 during reel-to-reel packaging processes. The fingerprint sensor chip 210 is electrically connected to the wiring film 230 by the first bumps 221 and the second bumps 222.

Figure 4:
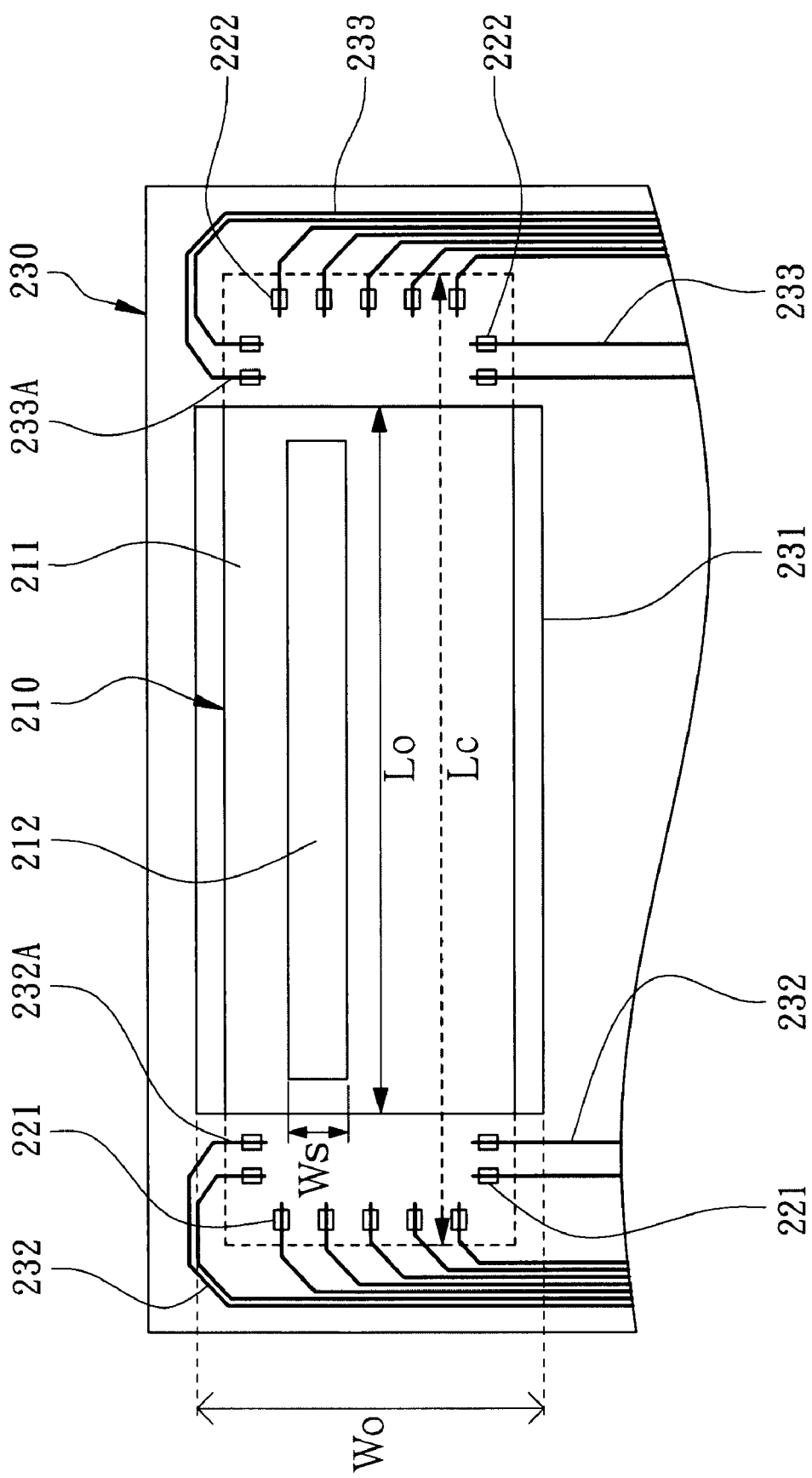
FIG. 4 shows a partially top view of the thin-film fingerprint sensor package according to the first embodiment of the present invention.

A sensing area 212 is formed on the active surface 211 of the fingerprint sensor chip 210. Normally, there are light-sensing components, RF sensing components, or sensing components which can sense pressures, temperatures, or capacitance formed in the sensing area 212 for fingerprint recognition. As shown in FIG. 4, the sensing area 212 is a strip or other shapes so that with fingers dynamically sliding or statically pressing on the sensing area 212, the fingerprints can be sensed and recognized. Moreover, the fingerprint sensor chip 210 has a plurality of bonding pads 213 formed on the active surface 211 as external electrodes.

The first bumps 221 and the second bumps 222 are disposed on the active surface 211 and are located at two opposing sides of the sensing area 212 where the first bumps 221 and the second bumps 222 are electrically connected to the corresponding bonding pads 213. The first bumps 221 and the second bumps 222 are distinguished by their locations. In this embodiment, as shown in FIG. 3, the first bumps 221 are located to the left of the sensing area 212 and the second bumps 222 to the right of the sensing area 212. Moreover, the first bumps 221 and the second bumps 222 can be arranged in linear or in U-shape, as shown in FIG. 4. Preferably, a plurality of dummy bumps (not shown in figures) without electrical functions may be added and disposed on the active surface 211 to enhance the bonding strengths of the first bumps 221 and the second bumps 222. Normally, the first bumps 221 and the second bumps 222 are a plurality of plated gold (Au) bumps but can be other conductive bumps such as stud bumps formed by wire bonding.

Figure 5:
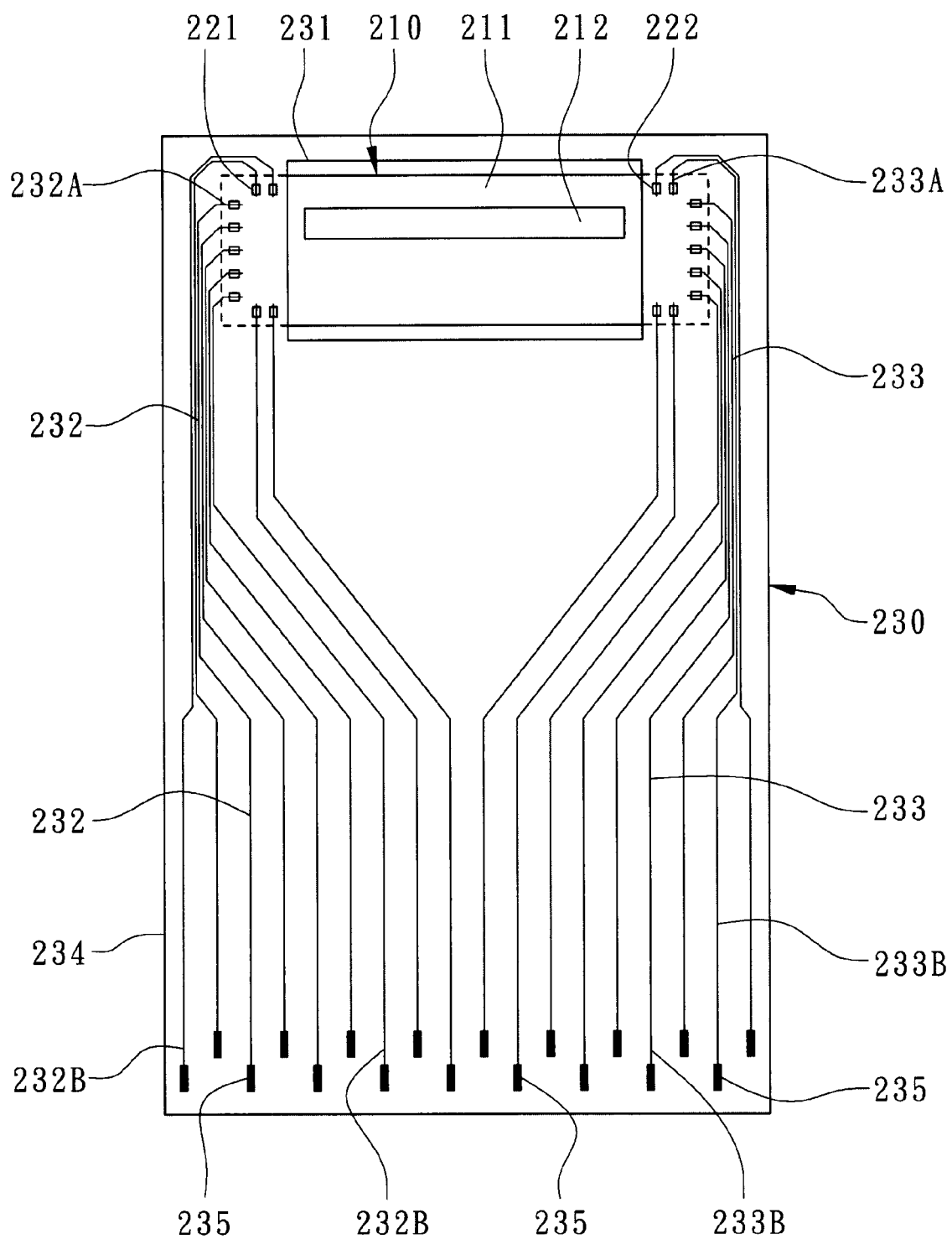
FIG. 5 shows a layout of a wiring film of the thin-film fingerprint sensor package according to the first embodiment of the present invention.

As shown in FIG. 3, the wiring film 230 has an opening 231 to expose the sensing area 212. As shown in FIG. 4 and FIG. 5, the wiring film 230 further has a plurality of first leads 232 and a plurality of second leads 233 where each first lead 232 has an inner end 232A and an outer end 232B and each second lead 233 has an inner end 233A and an outer end 233B. The inner ends 232A of the first leads 232 and the inner ends 233A of the second leads 233 are defined as the ends of the leads close to the opening 231 of the wiring film 230. The outer ends 232B of the first leads 232 and the outer ends 233B of the second leads 233 are defined the ends of the leads far away from the opening 231. The inner ends 232A of the first leads 232 are bonded to the first bumps 221 and the inner ends 233A of the second leads 233 to the second bumps 222 by ultrasonic bonding, thermal pressing, ACF bonding, or other flip chip bonding technologies, as shown in FIG. 3. Preferably, as shown in FIG. 5, the wiring film 230 further has a flexible extension 234, the outer ends 232B of the first leads 232 and the outer leads 233B of the second leads 233 are rerouted to the same extension 234. In the present embodiment, the wiring film 230 is parts of a chip-on-film (COF) tape, where the inner ends 232A of the first leads 232 and the inner ends 233A of the second leads 233 are not extended into the opening 231, as shown in FIG. 4, i.e., the inner ends 232A of the first leads 232 and the inner ends 233A of the second leads 233 are adhered to the dielectric layers of the wiring film 230 to eliminate the shaking and the shifting of the first leads 232 and the second leads 233 during flip-chip bonding processes.

As shown in FIG. 3 again, the first bumps 221 and the second bumps 222 are encapsulated by an encapsulant 240 where the encapsulant 240 can be a potting compound.

As shown in FIG. 4, the opening 231 of the wiring film 230 can be a slot. Preferably, the length, Lo, of the opening 231 is smaller than the length, Lc, of the active surface 211 of the fingerprint sensor chip 210 but is greater than the length of the sensing area 212. Moreover, the width, Wo, of the wiring film 230 is greater than the width, Ws, of the sensing area 212 of the active surface 211 of the fingerprint sensor chip 210 so that the encapsulant 240 can be formed and bonded to the COF without contamination the sensing area 212.

As shown in FIG. 5, the wiring film 230 further has a plurality of outer fingers 235 disposed on the extension 234, where the outer ends 232B of the first leads 232 and the outer ends 233B of the second leads 233 are connected to the outer fingers 235. Preferably, the outer fingers 235 are arranged in stagger to increase the pitches of the outer fingers 235 and to avoid shorts between the outer fingers 235. The outer fingers 235 can electrically connect to a printed circuit board, not shown in the figure, by anisotropic conductive film, ACF, solder-paste soldering, or socket connectors. In the present embodiment, the wiring film 230 is electrically connected to the bonding pads 213 of the fingerprint sensor chip 210 by the first bumps 221 and the second bumps 222 and is also electrically connected to a printed circuit board, not shown in the figure, by the outer fingers 235 at the extension 234 of the wiring film 230. Therefore, the thin-film fingerprint sensor package 200 has no substrate under the fingerprint sensor chip 210 nor external terminals under the substrate so that the overall thickness of the fingerprint sensor package is thinner without the SMT external terminals, the reliability of the fingerprint sensor package is better without the issues of the breaking of the external terminals causing electrical opens, and the accuracy of the horizontal alignment of the fingerprint sensor chip can be increase to enhance the sensitivities of the fingerprint recognitions. Moreover, the fingerprint sensor packages 200 can be assembled by reel-to-reel packaging processes.

As shown in FIG. 3, the thin-film fingerprint sensor package 200 further comprises a base 250 to accommodate and mechanically fix the fingerprint sensor chip 210. The base 250 can be disposed at any locations of the electronic devices to ensure the horizontal alignment of the sensing area 212 where the base 250 can be made of metal or plastic. In the present embodiment, the extension 234 of the wiring film 230 is located outside the base 250 as shown in FIG. 5.

Figure 6:
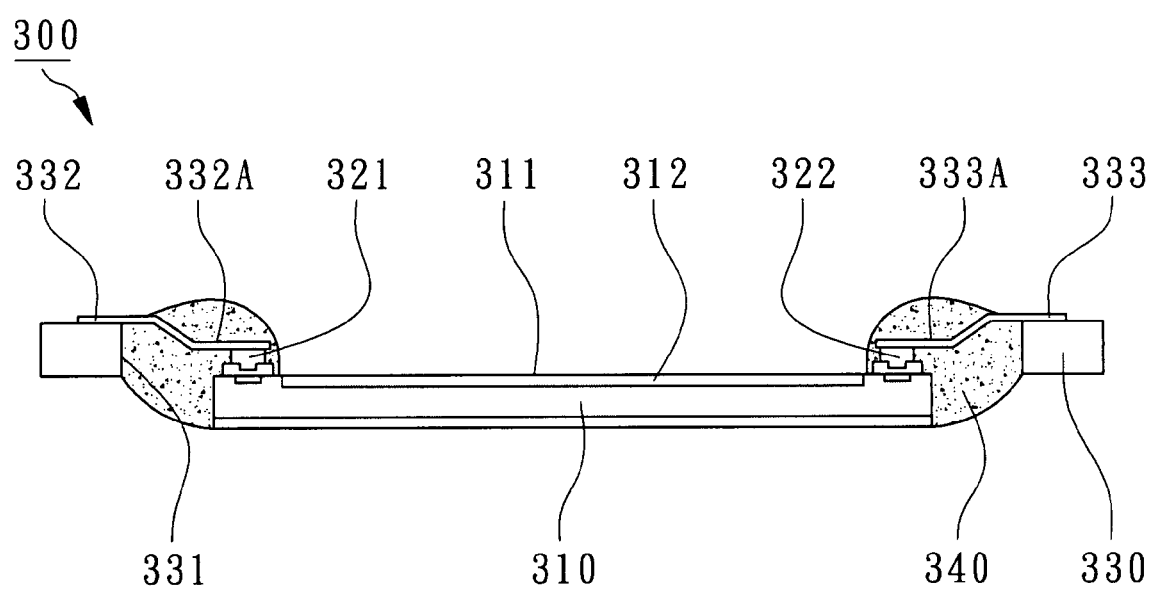
FIG. 6 shows a cross-sectional view of another thin-film fingerprint sensor package according to the second embodiment of the present invention.

Another thin-film fingerprint sensor package is revealed in FIG. 6 according to the second embodiment of the present invention. Another thin-film fingerprint sensor package 300 primarily comprises a fingerprint sensor chip 310, a plurality of first bumps 321, a plurality of second bumps 322, a wiring film 330 and at least an encapsulant 340. A sensing area 312 is formed on the active surface 311 of the fingerprint sensor chip 310 where the first bumps 321 and the second bumps 322 are disposed on the two opposing sides of the sensing area 312 on the active surface 311 of the fingerprint sensor chip 310.

The wiring film 330 has an opening 331 to expose the sensing area 312. The wiring film 330 further has a plurality of first leads 332 and a plurality of second leads 333 where a plurality of inner ends 332A of the first leads 332 are bonded to the first bumps 321 and a plurality of inner ends 333A of the second leads 333 to the second bumps 322. In the present embodiment, the wiring film 330 is parts of TCP, Tape Carrier Packaging, tape where the inner ends 332A of the first leads 332 and the inner ends 333A of the second leads 333 are extended to and suspended over the opening 331. Furthermore, a plurality of outer ends of the first leads 332 and a plurality of outer ends of the second leads 333 are rerouted to the same flexible extension of the wiring film 330 or are extended to two opposing sides of the wiring film 330, not shown in the figure. The first bumps 321 and the second bumps 322 are encapsulated by the encapsulant 340. The fingerprint sensor package 300 can be assembled by reel-to-reel packaging processes.

The above description of embodiments of this invention is intended to be illustrative and not limiting. Other embodiments of this invention will be obvious to those skilled in the art in view of the above disclosure.

What is claimed is:

1. A thin-film fingerprint sensor package comprising:
   a fingerprint sensor chip having an active surface including a sensing area; a plurality of first bumps and a plurality of second bumps, disposed on the active surface and locating at two opposing sides of the sensing area respectively;
   a wiring film having an opening exposing the sensing area, a plurality of first leads, a plurality of second leads and a flexible extension, wherein a plurality of inner ends of the first leads are bonded to the first bumps and a plurality of inner ends of the second leads to the second bumps, wherein a plurality of outer ends of the first leads and a plurality of outer ends of the second leads are rerouted to the extension; and
   at least an encapsulant encapsulating the first bumps and the second bumps.

2. The thin-film fingerprint sensor package of claim 1, wherein the encapsulant is a potting compound.

3. The thin-film fingerprint sensor package of claim 1, wherein the opening of the wiring film is a slot and the length of the opening is smaller than the one of the active surface of the fingerprint sensor chip but greater than the one of the sensing area, furthermore, the width of the opening is greater than the one of the sensing area.

4. The thin-film fingerprint sensor package of claim 1, wherein the wiring film is parts of a COF (Chip-On-Film) tape.

5. The thin-film fingerprint sensor package of claim 1, wherein the wiring film is parts of a TCP (Tape Carrier Package) tape.

6. The thin-film fingerprint sensor package of claim 1, further comprising a base to accommodate and mechanically fix the fingerprint sensor chip with the extension located outside the base.

7. The thin-film fingerprint sensor package of claim 1, wherein the wiring film further has a plurality of outer fingers disposed on the extension and connecting the outer ends of the first and the second leads.

8. The thin-film fingerprint sensor package of claim 7, wherein the outer fingers are arranged in staggers.

9. The thin-film fingerprint sensor package of claim 1, wherein the first and the second bumps are a plurality of plated gold bumps.

10. The thin-film fingerprint sensor package of claim 1, wherein the first and the second bumps are a plurality of stud bumps formed by wire bonding.

11. The thin-film fingerprint sensor package of claim 1, further comprising at least a dummy bump on the active surface.

12. A thin-film fingerprint sensor package comprising:
    a fingerprint sensor chip having an active surface including a sensing area;
    a plurality of first bumps and a plurality of second bumps, disposed on the active surface and locating at two opposing sides of the sensing area respectively;
    a wiring film having an opening exposing the sensing area, a plurality of first leads and a plurality of second leads, wherein a plurality of inner ends of the first leads are bonded to the first bumps and a plurality of inner ends of the second leads to the second bumps; and
    at least an encapsulant encapsulating the first bumps and the second bumps.

13. The thin-film fingerprint sensor package of claim 12, wherein the wiring film is parts of a (Chip-On-Film) tape.

14. The thin-film fingerprint sensor package of claim 12, wherein the wiring film is parts of a TCP (Tape Carrier Package) tape.

15. The thin-film fingerprint sensor package of claim 12, wherein the first and the second bumps are a plurality of plated gold bumps.

16. The thin-film fingerprint sensor package of claim 12, wherein the first and the second bumps are a plurality of stud bumps formed by wire bonding.

* * * * *